US005841723A

United States Patent [19]
Ma

[11] Patent Number: 5,841,723
[45] Date of Patent: Nov. 24, 1998

[54] METHOD AND APPARATUS FOR PROGRAMMING ANTI-FUSES USING AN ISOLATED WELL PROGRAMMING CIRCUIT

[75] Inventor: Manny Ma, Boise, Id.

[73] Assignee: Micron Technology, Inc., Boise, Id.

[21] Appl. No.: 47,759

[22] Filed: Mar. 24, 1998

Related U.S. Application Data

[63] Continuation of Ser. No. 653,964, May 28, 1996.

[51] Int. Cl.$^6$ ..................................................... G11C 7/00
[52] U.S. Cl. ................. 365/225.7; 365/200; 365/189.09
[58] Field of Search ................................ 365/225.7, 200, 365/189.09

[56] References Cited

U.S. PATENT DOCUMENTS

| | | | |
|---|---|---|---|
| 4,730,129 | 3/1988 | Kunitoki et al. | 307/362 |
| 4,775,959 | 10/1988 | Sato et al. | 365/189 |
| 5,130,777 | 7/1992 | Galbraith et al. | 365/96 |
| 5,191,550 | 3/1993 | Kubota | 365/96 |
| 5,243,226 | 9/1993 | Chan | 307/465 |
| 5,257,222 | 10/1993 | Lee | 365/96 |
| 5,299,151 | 3/1994 | Ishihara et al. | 365/96 |
| 5,299,152 | 3/1994 | Ishihara et al. | 365/96 |
| 5,301,159 | 4/1994 | Lee | 365/96 |
| 5,311,480 | 5/1994 | Schreck | 365/230.06 |
| 5,316,971 | 5/1994 | Chiang et al. | 437/170 |
| 5,319,592 | 6/1994 | Nguyen | 365/96 |
| 5,392,253 | 2/1995 | Atsumi et al. | 365/230.06 |
| 5,404,049 | 4/1995 | Canada et al. | 326/38 |
| 5,412,593 | 5/1995 | Magel et al. | 365/96 |
| 5,426,614 | 6/1995 | Harward | 365/225.7 |
| 5,469,396 | 11/1995 | Eltoukhy | 365/96 |
| 5,495,436 | 2/1996 | Callahan | 365/96 |
| 5,514,980 | 5/1996 | Pilling et al. | 326/38 |

FOREIGN PATENT DOCUMENTS

| | | | |
|---|---|---|---|
| 0 436 247 A | 7/1991 | European Pat. Off. | G06K 1/15 |
| 58021856 | 2/1983 | Japan | H01L 27/04 |

OTHER PUBLICATIONS

Calligaro et al., "Positive and Negative CMOS Voltage Multiplier for 5–V–Only Flash Memories" 38$^{th}$ Midwest Symposium on Circuits and Systems: Proceedings, Rio De Janeiro, 1(38):294–297, 1995.

Primary Examiner—David C. Nelms
Assistant Examiner—Trong Phan
Attorney, Agent, or Firm—Seed and Berry LLP

[57] ABSTRACT

A method and apparatus for programming anti-fuses using a positive voltage switching circuit for connecting an external terminal receiving a positive programming voltage to one plate of an anti-fuse responsive to an active program enable signal. A negative voltage switching circuit connects an external terminal receiving a negative programming voltage to the other plate of the anti-fuse responsive to the active program enable signal. The negative voltage switching circuit normally maintains one plate of the anti-fuse at ground potential when the anti-fuse is not being programmed so that its conductive state can be read by applying a voltage to the other plate of the anti-fuse. The transistors used in the negative voltage switching circuit are fabricated in a well that is isolated from the substrate in which the transistors in the positive voltage switching circuit are fabricated. As a result, the negative programming voltage coupled to the well is not coupled to the substrate, thereby avoiding overstress of the gate oxide layers and p-n junctions in MOSFETs of the integrated circuit. The negative voltage switching circuit includes a switch for coupling the well and the substrate to each other during normal operating modes and for isolating them from each other when the anti-fuse is being programmed.

69 Claims, 4 Drawing Sheets

METHOD AND APPARATUS FOR PROGRAMMING ANTI-FUSES USING AN ISOLATED WELL PROGRAMMING CIRCUIT

CROSS-REFERENCE TO RELATED APPLICATION

This application is a continuation of U.S. patent application Ser. No. 08/653,964, filed May 28, 1996, now pending.

TECHNICAL FIELD

The present invention relates to programming anti-fuses in semiconductor circuits, and more particularly, to a method and apparatus for programming anti-fuses with a sufficiently high voltage to provide a consistently low resistance of the programmed anti-fuse without overstressing other components of the integrated circuit.

BACKGROUND OF THE INVENTION

Anti-fuses are a common component in conventional integrated circuits. An anti-fuse is a circuit element that is normally open circuited until it is programmed at which point the anti-fuse assumes a relatively low resistance. Anti-fuses are commonly used to selectively enable certain features of integrated circuits and to perform back end repairs of integrated circuits. Back end repairs of integrated circuits are typically accomplished by "blowing" anti-fuses to signal defective portions of the integrated circuit that they should be replaced with redundant circuits. For example, a defective row of memory cells in the array of a dynamic random access memory can be replaced with a redundant row of cells provided for that purpose.

Conventional anti-fuses are similar in construction to capacitors in that they include a pair of conductive plates separate from each other by a dielectric or insulator. Anti-fuses are typically characterized by the nature of the dielectric which may be, for example, oxide or nitride. Anti-fuses are programmed or "blown" by applying a differential voltage between the plates that is sufficient to break down the dielectric thereby causing the plates to contact each other. Typically this relatively high programming voltage is applied to the chip externally through terminals that are normally used for other purposes. For example, in a DRAM, a high voltage may be applied to one of the data bit terminals after the integrated circuit has been placed in a programming mode by, for example, applying a predetermined combination of bits to other terminals of the integrated circuit.

Although conventional anti-fuses as described above have worked well in many applications, they nevertheless have several shortcomings, particularly when used in more recent, high density integrated circuits. In particular, the programmed resistance of anti-fuses varies over a considerable range, and the programmed resistance is often far higher than is desired. For example, sometimes the programmed resistance is high enough that circuitry connected to the anti-fuse mistakenly determines that the anti-fuse is open circuited. It is generally known that programming anti-fuses with a higher voltage will both lower the programmed resistance and provide a more uniform resistance. However, the magnitude of the programming voltage that can be applied to anti-fuses is severely limited by the presence of other circuitry in the integrated circuit. In particular, since the terminals on which the programming voltage is applied are typically used for other functions, excessive programming voltages can easily break down the gate oxide layers of MOSFETs connected to such terminals thereby making such transistors defective. The problem of programming voltages breaking down the gate oxide layer of MOSFETs is exacerbated by the wide range of operating voltages of typical integrated circuits. For example, recent integrated circuits are capable of operating with a supply voltage of 3.5 volts in order to minimize power consumption, but they must still be able to operate with a commonly used supply voltage of 5 volts.

If the programming voltage was coupled to the integrated circuit substrate, excessive voltages could still be coupled across the gate oxide layers of MOSFETs, even though the programming voltage was not applied directly to the gates of the transistors.

Figure 1:
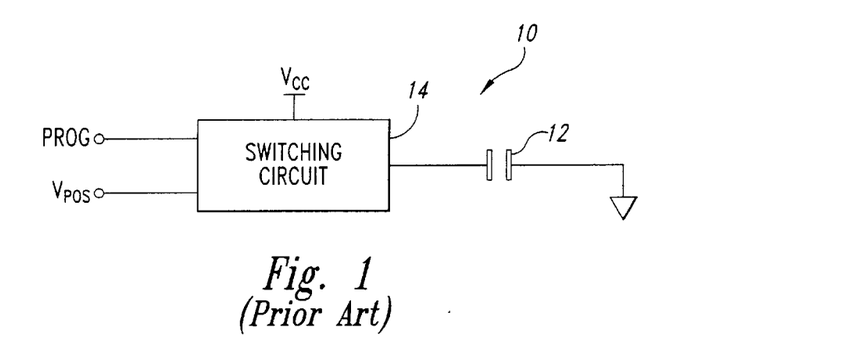
FIG. 1 is a block diagram of a prior art circuit for programming an anti-fuse.

A prior art programming circuit is illustrated in FIG. 1. The circuit 10 includes an anti-fuse 12 of conventional variety that is connected between circuit ground and the output of a switching circuit 14. The switching circuit 14 receives a supply voltage VCC, a program control signal PROG, and a relatively large positive voltage $V_{POS}$. When the anti-fuse 12 is to be programmed, the relatively large positive voltage $V_{POS}$ is applied to the programming circuit 14, and the programming circuit 14 is then enabled by a positive going PROG signal. Alternatively, a position PROG signal can be applied to enable the switching circuit 14 followed by the relatively large positive voltage $V_{POS}$. In either case, the switching circuit 14 then applies the voltage $V_{POS}$ to the anti-fuse 12. The magnitude of the voltage $V_{POS}$ is intended to be sufficient to adequately blow the anti-fuse 12 so that it consistently has a relatively low voltage. However, in practice, the resistances of blown anti-fuses 12 vary considerably and may even be interpreted as open circuits, i.e., unblown anti-fuses. While anti-fuses 12 can be programmed to consistently provide a relatively low resistance by using a larger voltage $V_{POS}$, doing so could easily overstress MOSFETs and exceed the breakdown voltage of bipolar ESD protection transistors in the integrated circuit in which the switching circuit 14 and anti-fuse 12 are fabricated. Thus, in practice, the anti-fuse 12 is sometimes not adequately blown.

Figure 2:
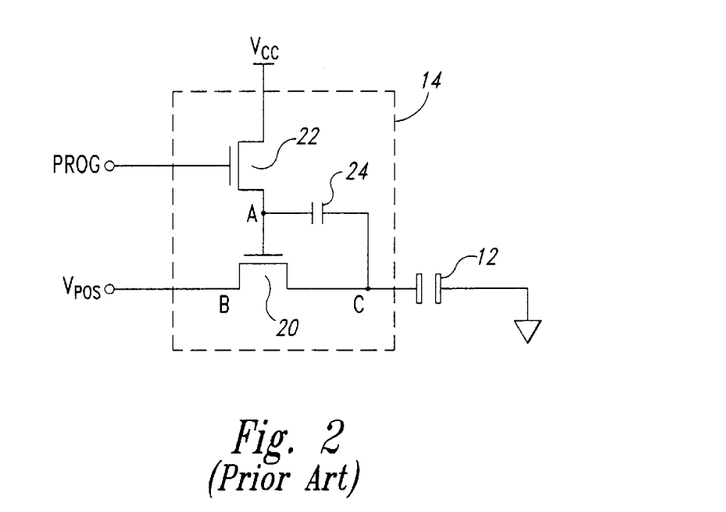
FIG. 2 is a schematic of the prior art programming circuit of FIG. 1.
Figure 3:
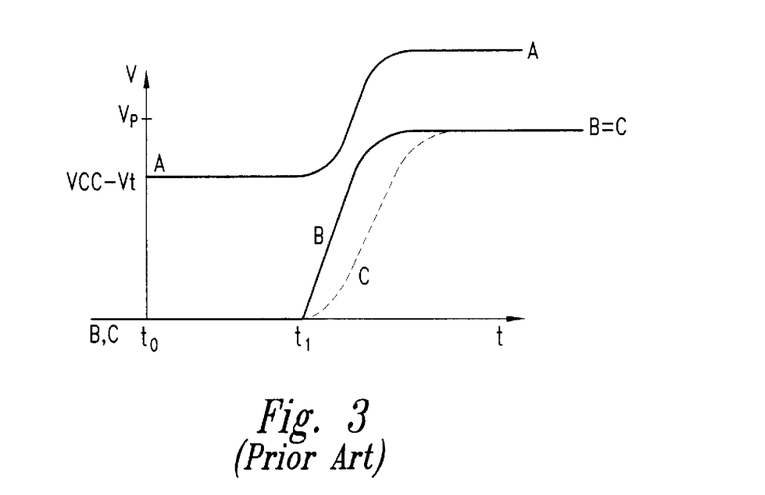
FIG. 3 is a timing diagram showing waveforms present at various nodes in the circuit of FIG. 2.

A conventional programming circuit 14 is shown in FIG. 2 in greater detail. The relatively large positive voltage $V_{POS}$ is applied to the drain of a first NMOS transistor 20 that is connected through its source to the anti-fuse 12. The gate of the NMOS transistor 20 is connected to the source of a second NMOS transistor 22, and a capacitor 24 is connected between the gate and source of the NMOS transistor 20. The gate of the second NMOS transistor 22 receives the programming signal PROG while its drain is connected to supply voltage VCC. In operation, the program PROG signal goes high to turn on the transistor 22, thereby applying the supply voltage VCC less the threshold voltage of transistor 22 to the gate of the transistor 20. The transistor 20 then turns on so that the voltage $V_{POS}$ applied to the drain of the transistor 20 after PROG goes high is coupled to the anti-fuse 12. It will be appreciated that the voltage applied to the anti-fuse 12 can be no greater than the voltage applied to the gate of the transistor 20 less threshold voltage $V_T$ of the transistor 20. Thus, without the capacitor 24 (the function of which is described below), the transistor 20 could only apply the supply voltage VCC less the transition voltage $V_T$ to the anti-fuse 12, regardless of the magnitude of $V_{POS}$. When the NMOS transistor 20 applies the supply voltage VCC to the gate of the transistor 20, the voltage at the source of the NMOS transistor 20 increases toward the supply voltage VCC less the transition voltage $V_T$. However, because the gate of the transistor 20 is coupled to its source through the capacitor 24, and because the voltage across a capacitor 24 cannot change instantaneously, the voltage at the gate of the transistor 20 increases along with the voltage at its source, as illustrated in FIG. 3. Thus, as shown in FIG. 3, the voltage at the gate of the NMOS transistor 20 (node A) increases at time $t_0$ from 0 volts to VCC—$V_T$. However, the voltage $V_{POS}$ at node B is still at 0 so that the gate of the NMOS transistor 20 remains at 0 volts. When the voltage $V_{POS}$ increases from 0 volts to $V_P$ starting at time $t_1$, the voltage at the source of the NMOS transistor 20 (node C) follows it. This increase is then coupled through the capacitor 24 to the gate of the NMOS transistor 20 (node A) so that the voltage at node A also increases by approximately $V_P$ starting at about time $t_1$. It will be apparent from FIG. 3 that the voltage at node A reaches a voltage that is considerably above $V_P$ so that the NMOS transistor 20 is able to supply a voltage $V_P$ to the anti-fuse 12 that is above the supply voltage VCC. However, as mentioned above, the magnitude of $V_P$ is limited by the susceptibility to damage of other components fabricated on the integrated circuit. Thus, the prior art circuit illustrated in FIGS. 1–3 has serious shortcomings which do not appear to be solvable without making the other components in the integrated circuit less susceptible to overstress.

There is therefore a need for a method and apparatus for programming anti-fuses with a relatively high voltage in a manner that does not damage other components in an integrated circuit.

SUMMARY OF THE INVENTION

In accordance with the inventive method and apparatus for programming an anti-fuse formed in an integrated circuit, a first programming voltage having one polarity is applied to a first terminal of an anti-fuse, and a second programming voltage having a polarity opposite the polarity of the first programming voltage is applied to a second terminal of the anti-fuse. As a result, the anti-fuse receives a voltage corresponding to the difference between the first and second programming voltages. The first programming voltage is preferably applied to the first terminal of the anti-fuse through a first switching circuit responsive to receiving a program enable signal at an enable input of the first switching circuit. Similarly, the second programming voltage is preferably applied to the second terminal of the anti-fuse through a second switching circuit responsive to receiving the program enable signal at an enable input of the second switching circuit.

The integrated circuit preferably includes a semiconductor substrate in which the first switching circuit is formed, and the second switching circuit is formed in a well that is electrically isolated from the substrate. The first and second switching circuits may each include at least one MOSFET to which the first and second programming voltages are applied so that a junction formed by the MOSFET for one switching circuit will be forward biased. It is the switching circuit having the forward biased junction that is formed in the well so that the switching voltage is not coupled to the substrate through the forward biased junction. The MOSFETs are preferably series MOSFETs each of which has its source and drain connected in series between its respective externally accessible terminal and its respective terminal of the anti-fuse. Each of the series MOSFETs is preferably coupled to the enable input of its respective switching circuit, and they are turned on responsive to the program enable signal. One of the switching circuits may further include a shunt MOSFET having its source and drain connected between its respective terminal of the anti-fuse and a fixed voltage. The shunt MOSFET is coupled to the enable input of its switching circuit and is turned off responsive to the program enable signal and is turned on responsive to the absence of the program enable signal.

The programming circuit also preferably includes an isolation circuit connected between the well and the substrate. The isolation circuit is coupled to the program enable signal to electrically isolate the well from the substrate responsive to the program enable signal and electrically connect the well to the substrate responsive to the absence of the program enable signal during normal operation.

Although the inventive method and apparatus for programming integrated circuit anti-fuses can be used in any type of integrated circuit, it is advantageously used in dynamic random access memories which may be part of a computer system. The inventive programming method and apparatus may be used to program all types of anti-fuses, including those formed by conductive plates separated from each other by a dielectric or insulative material.

DETAILED DESCRIPTION OF THE INVENTION

Figure 4:
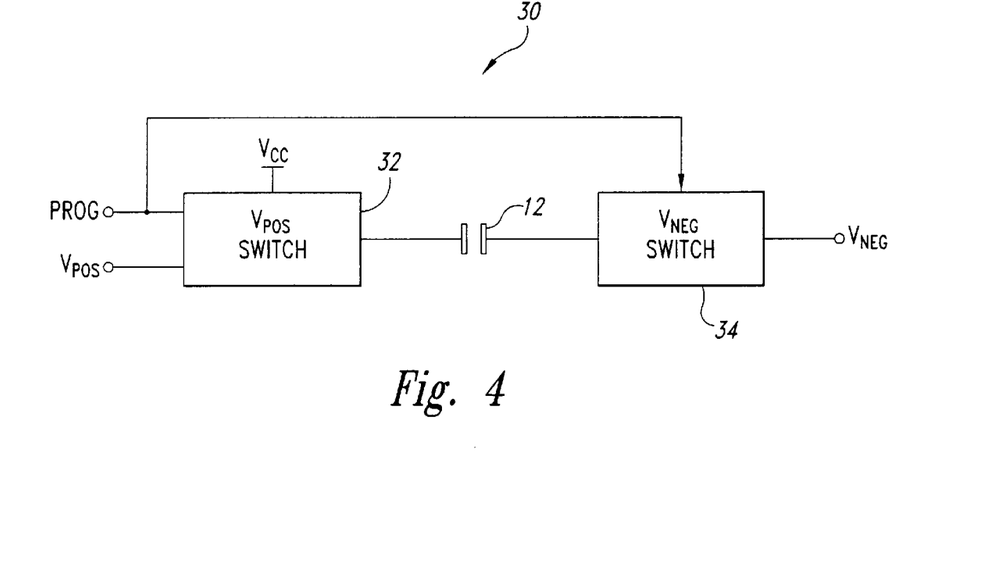
FIG. 4 is block diagram of a preferred embodiment of the inventive system for safely programming an anti-fuse with a relatively high voltage.

A preferred embodiment of the inventive method and apparatus for programming anti-fuses is illustrated in FIG. 4. The inventive system 30 includes a $V_{POS}$ switch 32 which may be identical to the switching circuit 14 illustrated in FIGS. 1 and 2. The $V_{POS}$ switch 32 is connected to one plate of the anti-fuse 12, and it applies a relatively large voltage $V_{POS}$ to the plate of the anti-fuse 12 when a programming input PROG is high, as explained above. The other plate of the anti-fuse 12 is connected to a $V_{NEG}$ switch 34 which receives a relatively large negative voltage $V_{NEG}$. The $V_{NEG}$ switch applies the voltage $V_{NEG}$ to the other plate of the anti-fuse 12 upon receipt of an active high programming input PROG. Thus, when PROG is high and a relatively large positive voltage $V_{POS}$ is applied to the $V_{POS}$ switch 32 and a relatively large negative voltage $V_{NEG}$ is applied to the $V_{NEG}$ switch 34, the anti-fuse 12 receives a relatively large differential voltage corresponding to the difference between $V_{POS}$ and $V_{NEG}$. This relatively large differential voltage can consistently program the anti-fuse 12 to a relatively low resistance. Moreover, it can do so without damaging other components in the integrated circuit since the values of $V_{POS}$ and $V_{NEG}$ are kept below the breakdown voltage of the various components in the integrated circuit.

Figure 5:
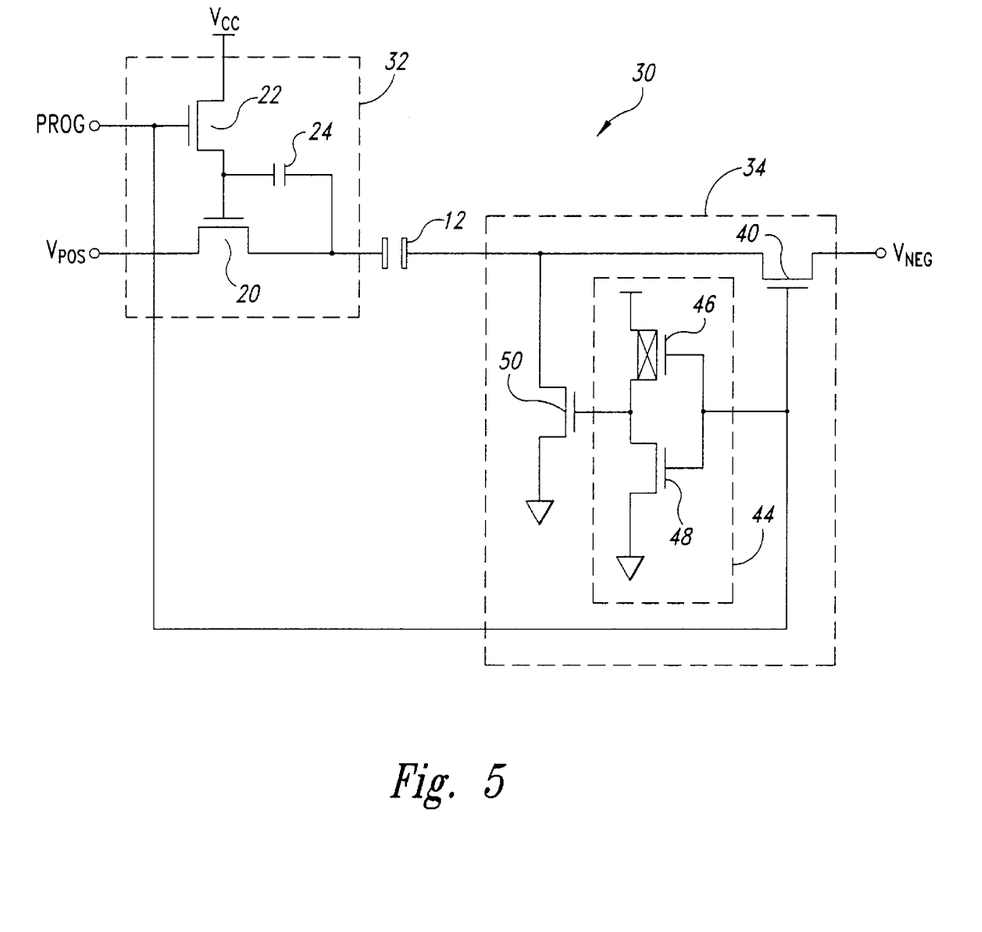
FIG. 5 is a schematic of one embodiment of a circuit for implementing the inventive programming system of FIG. 4.

The programming system 30 of FIG. 4 is shown in greater detail in FIG. 5. However, since the $V_{POS}$ switch 32 in FIG. 4 is identical to the switching circuit 14 of FIG. 1, the circuit for the $V_{POS}$ switch 32 shown in FIG. 5 is identical to the circuit 14 shown in FIG. 2. Thus, identical components have been given the same reference numerals and, in the interest of brevity, a detailed explanation of the $V_{POS}$ switch 32 will not be repeated. The $V_{NEG}$ circuit 34 includes an NMOS transistor 40 connected between the $V_{NEG}$ input and the anti-fuse 12. When the NMOS transistor 40 is turned on as explained below, the voltage $V_{NEG}$ is applied to the anti-fuse 12. The gate of the NMOS transistor 40 is connected to the programming input PROG so that an active high programming signal PROG turns on the transistor 40.

The programming input PROG is also applied to an inverter 44 formed by a PMOS transistor 46 and an NMOS transistor 48 connected to each other in a conventional manner for forming an inverter. The output of the inverter 44 is applied to the gate of an NMOS transistor 50. The NMOS transistor 50 is connected between the anti-fuse 12 and ground so that, when turned on, the NMOS transistor 50 connects one plate of the anti-fuse 12 to ground. Since the gate of the anti-fuse is connected to the programming input PROG through the inverter 44, the transistor 50 is turned on whenever the programming input PROG is inactive low. Thus, the programming input PROG ultimately turns on either the NMOS transistor 40 to program the anti-fuse 12 or, in its normal operating mode, turns on the NMOS transistor 50 to maintain one plate of the anti-fuse 12 at ground. Since one plate of the anti-fuse 12 is maintained at ground, its state can be read by applying a signal to the other plate of the anti-fuse 12 by conventional anti-fuse reading circuitry (not shown).

Figure 6:
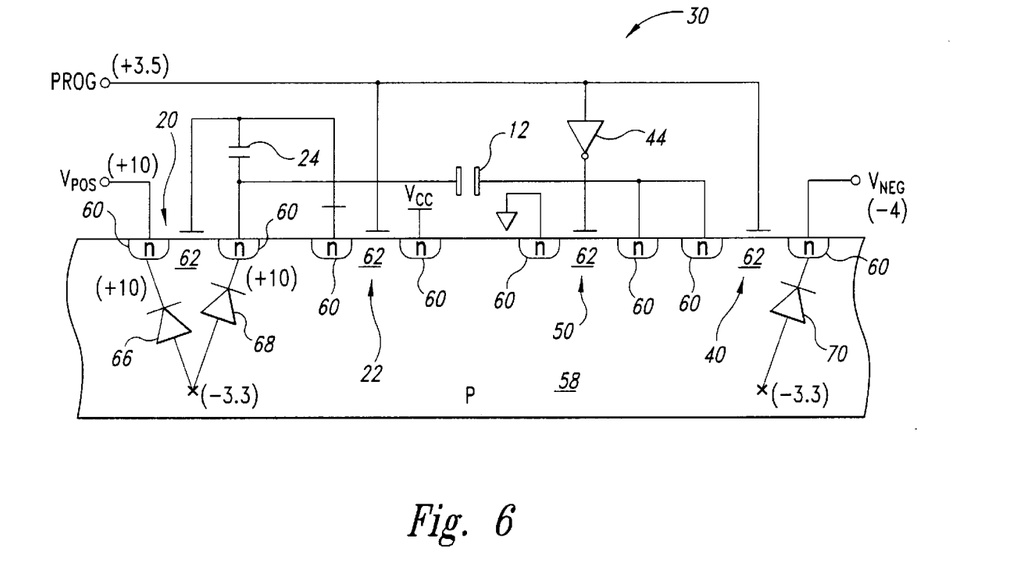
FIG. 6 is a schematic cross-section of a portion of the circuit of FIG. 5 fabricated on a silicon wafer and a circuit schematic of other portions of the circuit of FIG. 5 connected to the portion fabricated on a silicon wafer.

Although the inventive method and apparatus shown in FIG. 5 can program anti-fuses 12 to a consistently low resistance, it is not the preferred embodiment of the invention for reasons explained below with reference to FIG. 6. Referring, now to FIG. 6, the circuitry of FIG. 5 can be implemented in a silicon wafer using conventional fabrication techniques. The circuitry 30 is fabricated by forming the transistors 20, 22, 50 and 40 with n-type regions 60 separated from each other by a channel 62. In addition to forming the NMOS transistors 20, 22, 50, 40, the n-type regions 60 in the p-type substrate 58 form respective diodes because of the p-n junction, three of which 66, 68, 70 are illustrated in FIG. 6. Focusing, now, on the rightmost diode 70, the n-type region 60 forming the source of the NMOS transistor 40 receives the relatively large negative voltage $V_{NEG}$, as explained above. For purposes of illustration, let us assume that $V_{NEG}$ is −4 volts. Under these circumstances, the diode 70 is forward biased so that the substrate 58 will be maintained at approximately −3.3 volts. Assuming for purposes of illustration that the relatively large positive voltage $V_{POS}$ is +10 volts, the p-n junctions forming the diode 66, 68 will be back biased by a differential voltage of about 13.3 volts, i.e., the difference between +10 and −3.3. This 13.3 voltage across the p-n junction can easily overstress the junctions thereby damaging the transistors containing those junctions. Moreover, the embodiment shown in FIG. 5 can easily overstress oxide layers (not shown) forming the gates of the NMOS transistors 20, 22, 50. As explained above, when the voltage $V_{POS}$ is applied to the drain of the NMOS transistor 20, the gate of the transistor 20 is booted to a relatively large voltage. In the above example, where $V_{POS}$ is +10 volts and $V_{NEG}$ is −4 volts, let it also be assumed that PROG is 3.5 V and $V_T$ for the transistors 20, 22 is 1 volt. With this example, transistor 22 will initially apply 2.5 V (PROG less $V_T$) to the gate of the NMOS transistor 20. When $V_{POS}$ (+10 V) is applied to the drain of the transistor 20, its gate will be booted through the capacitor 24 to 12.5 V. The voltage across the oxide layer of the gate for the transistor 20 will thus be the difference between the gate voltage and the voltage of the substrate, or 15.8 volts, i.e., 12.5+3.3 V. This 15.8 volts can easily break down the gate oxide layer of many NMOS transistors.

Figure 7:
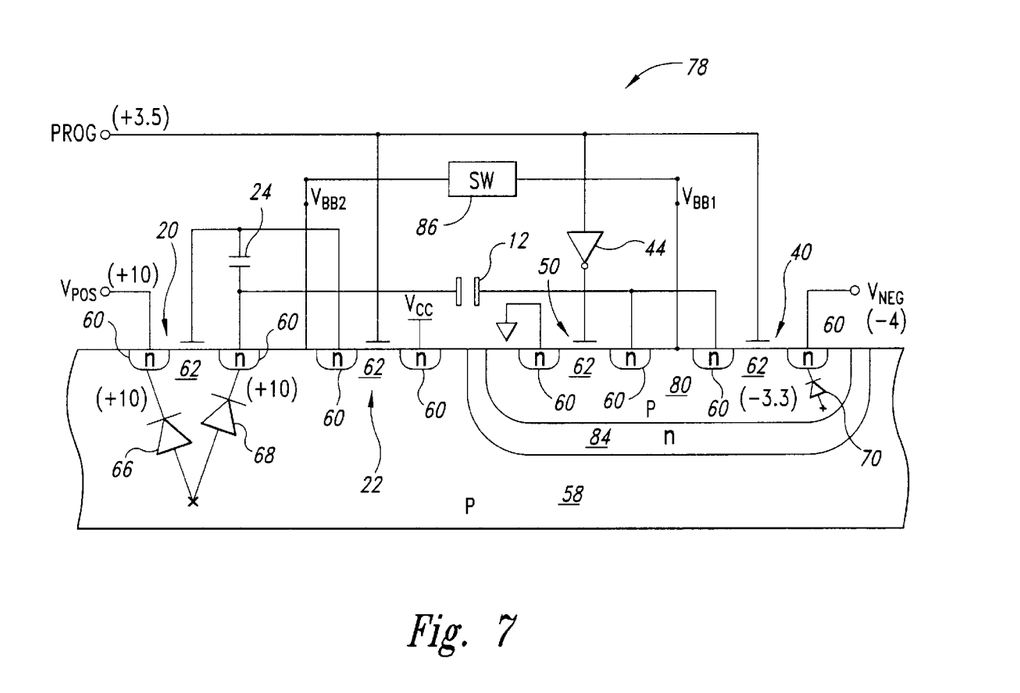
FIG. 7 is a schematic cross-section of a portion of the preferred embodiment of the invention fabricated on a silicon wafer and a circuit schematic of other portions of the of the preferred embodiment of the invention connected to the portion fabricated on a silicon wafer.

The preferred embodiment of the invention which avoids overstressing gate oxide layers and p-n junctions is illustrated in FIG. 7 in which like components have been provided with the same reference numbers. In the interest of brevity, the structure and operation of these components will not be repeated. The preferred embodiment of FIG. 7 differs from the embodiment of FIG. 6 in that the NMOS transistors 50, 40 are formed in a p-well 80 that is isolated from the p-type substrate 58 by an n-type region 84. As a result, the p-well 80 is electrically isolated from the substrate 58. A relatively large negative voltage $V_{NEG}$ of −4 volts will still cause the p-n junction formed by the n-type region 60 forming the source of the transistor 40. As a result, the p-well 80 will be biased to −3.3 volts. However, since the p-well 80 is isolated from the substrate 58, the substrate 58 will not be driven to −3.3 volts. As a result, neither the gate oxide layers of the transistors 20, 22 nor the diodes 66, 68 formed by the p-n junctions in the substrate 58 will be overstressed. However, the p-well 80 is connected to the substrate 58 in normal operation, by interconnecting their respective terminals VBB1 and VBB2 with a switch 86, as explained below.

Figure 8:
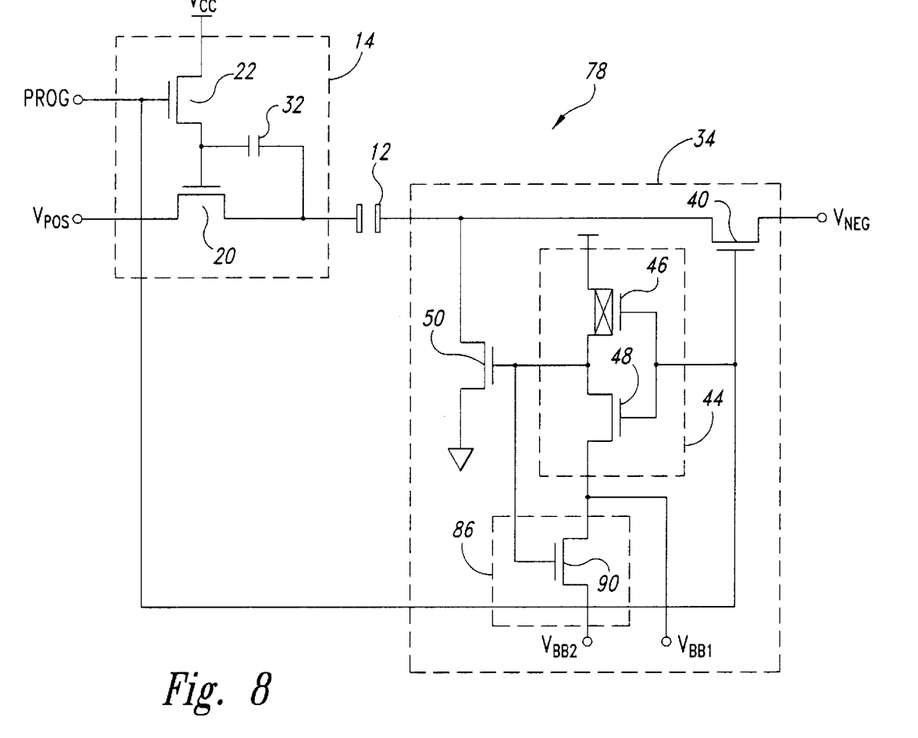
FIG. 8 is a schematic of the preferred embodiment of the invention shown in FIG. 7.

The preferred embodiment of the invention 78 as shown in FIG. 7 is illustrated in FIG. 8. Once again, since most of the components of the preferred embodiment 78 are identical to the embodiment 30 shown in FIG. 5, identical components have been provided with the same reference numerals and, in the interest of brevity, an explanation of these components will not be repeated. The preferred embodiment 78 shown in FIG. 8 differs from the embodiment 30 shown in FIG. 5 by the inclusion of the switch circuit 86 (FIG. 8) for connecting the p-well terminal VBB1 to the substrate terminal VBB2 during normal operation. The switch 86 is formed by an NMOS transistor 90 having its source connected to the substrate terminal VBB2 and its drain connected to the p-well terminal VBB1. In operation, when the programming input PROG is inactive low, the inverter 44 outputs a high which, as explained above, turns on the NMOS transistor 50 to maintain one plate of the anti-fuse 12 at ground. The high applied to the gate of the transistor 50 is also applied to the gate of the NMOS transistor 90 to turn on the NMOS transistor 90, thereby connecting the VBB1 terminal to the VBB2 terminal. When the PROG signal is active high, the inverter 44 outputs a low to turn off both the NMOS transistor 50 and the NMOS transistor 90. Turning off the transistor 90 isolates the VBB1 terminal from the VBB2 terminal, thereby isolating the p-well 80 from the substrate 58, as explained above with reference to FIG. 7.

Figure 9:
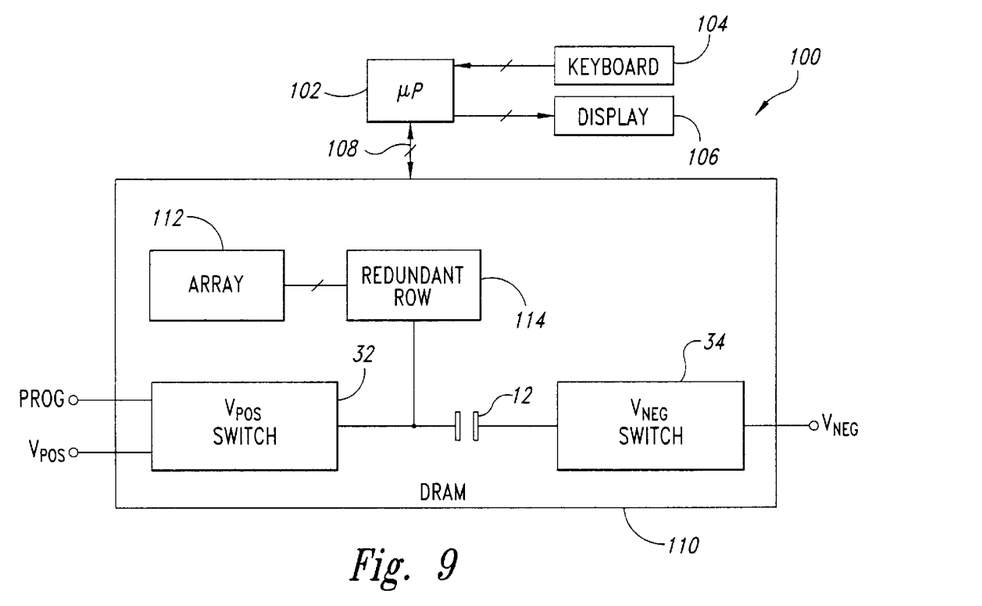
FIG. 9 is a block diagram of a computer system including a dynamic random access memory employing the inventive anti-fuse programming method and apparatus.

The inventive method and apparatus can be used with any integrated circuit having an anti-fuse 12. However, it is advantageously used in a dynamic random access memory ("DRAM") used in a computer system as shown in FIG. 9. With reference to FIG. 9, the computer system 100 includes a microprocessor 102 of conventional design connected to an input device, such as a keyboard 104 and an output device, such as a display 106. The microprocessor 102 is also connected through a bus system 108 to a dynamic random access memory ("DRAM") 110. As is conventional with the DRAM 110, it includes an array 112 of memory cells and a redundant row of memory cells 114 provided to replace a row of memory cells in the array 112 that is found to be defective. The redundant row 114 has an enable input which may be coupled to ground through the anti-fuse 12 in the normal operating mode. The anti-fuse 12 is also connected between the $V_{POS}$ switch 32 and the $V_{NEG}$ switch 34. As explained above, the $V_{POS}$ switch 32 applies a positive voltage $V_{POS}$ to the anti-fuse 12 and the $V_{NEG}$ switch 34 outputs a negative voltage to the anti-fuse 12 when PROG goes active high. When PROG is inactive low, the plate of the anti-fuse 12 connected to the $V_{NEG}$ switch 34 is at ground so that the state of the anti-fuse 12 can be read by the redundant row of memory cells 114.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A programming circuit for programming an anti-fuse having first and second terminals, said programming circuit and said anti-fuse being fabricated in a common integrated circuit, said programming circuit comprising:

a first switching circuit connected between a first externally accessible terminal of said integrated circuit and the first terminal of said anti-fuse, said first switching circuit further having an enable input, said first switching circuit being capable of coupling a first programming voltage having one polarity from said first externally accessible terminal to the first terminal of said anti-fuse responsive to a program enable signal being applied to the enable input of said first switching circuit; and a second switching circuit connected between a second externally accessible terminal of said integrated circuit and the second terminal of said anti-fuse, said second switching circuit further having an enable input, said second switching circuit being capable of coupling a second programming voltage having a polarity opposite to the polarity of the first programming voltage from said second externally accessible terminal to the second terminal of said anti-fuse responsive to said program enable signal being applied to the enable input of said second switching circuit whereby a voltage corresponding to the difference between said first and second programming voltages is applied to said anti-fuse responsive to said program enable signal.

2. The programming circuit of claim 1 wherein said integrated circuit includes a semi-conductor substrate, and wherein at least one of said switching circuits is formed in a well that is electrically isolated from said substrate.

3. The programming circuit of claim 1 wherein said integrated circuit includes a semi-conductor substrate in which said first switching circuit is formed, and wherein said second switching circuit is formed in a well that is electrically isolated from said substrate.

4. The programming circuit of claim 3 wherein said first and second switching circuits each include at least one MOSFET to which said first and second programming voltages are applied, respectively, and wherein said second programming voltage has a polarity that forward-biases a junction formed by its respective MOSFET and said well.

5. The programming circuit of claim 4 wherein said substrate and said well are formed with p-type doping so that said MOSFETs are NMOS transistors, and wherein said second programming voltage has a negative polarity and said first programming voltage has a positive polarity.

6. The programming circuit of claim 1 wherein said first and second switching circuits each include a respective series MOSFET having its source and drain connected in series between its respective externally accessible terminal and its respective terminal of said anti-fuse, and wherein each of said series MOSFETs is coupled to the enable input of its respective switching circuit and is turned on responsive to said program enable signal.

7. The programming circuit of claim 6 wherein one of said switching circuits further includes a shunt MOSFET having its source and drain connected between its respective plate of said anti-fuse and a fixed bias voltage, and wherein said shunt MOSFET is coupled to the enable input of its switching circuit and is turned off responsive to said program enable signal and is turned on responsive to the absence of said program enable signal.

8. The programming circuit of claim 1 wherein said integrated circuit includes a semi-conductor substrate, wherein at least one of said switching circuits is formed in a well that is electrically isolated from said substrate, and wherein said programming circuit further includes an isolation circuit connected between said well and said substrate and being coupled to said program enable signal, said isolation circuit electrically isolating said well from said substrate responsive to said program enable signal and electrically connecting said well to said substrate responsive to the absence of said program enable signal.

9. The programming circuit of claim 1 wherein said anti-fuse is formed by first and second conductive plates connected to said first and second terminals, respectively, said plates being separated from each other by a non-conductive material.

10. A programming circuit for programming an anti-fuse having first and second terminals, said programming circuit and said anti-fuse being fabricated in a common integrated circuit having a p-type substrate, said programming circuit comprising:

a p-well formed in said substrate and being separated from said substrate by a layer of n-type semi-conductor material so that said p-well is electrically isolated from said substrate;

a first switching circuit formed in said substrate, said first switching circuit including an NMOS transistor connected between a first externally accessible terminal of said integrated circuit and the first terminal of said anti-fuse, said first switching circuit further having an enable input coupled to the gate of said NMOS transistor, said NMOS transistor being capable of coupling a positive programming voltage from said first externally accessible terminal to the first terminal of said anti-fuse responsive to a program enable signal being applied to the enable input of said first switching circuit; and a second switching circuit formed in said p-well, said second switching circuit including an NMOS transistor connected between a second externally accessible terminal of said integrated circuit and the second terminal of said anti-fuse, said second switching circuit further having an enable input coupled to the gate of said NMOS transistor, said NMOS transistor being capable of coupling a negative programming voltage from said second externally accessible terminal to the second terminal of said anti-fuse responsive to said program enable signal being applied to the enable input of said second switching circuit whereby a voltage corresponding to the difference between said positive and negative programming voltages is applied to said anti-fuse responsive to said program enable signal.

11. The programming circuit of claim 10 wherein said programming circuit further includes an isolation circuit connected between said p-well and said substrate and being coupled to said program enable signal, said isolation circuit electrically isolating said p-well from said substrate responsive to said program enable signal and electrically connecting said p-well to said substrate responsive to the absence of said program enable signal.

12. A dynamic random access memory fabricated on an integrated circuit having a substrate, comprising:
an array of memory cells formed in said substrate in rows and columns;
an anti-fuse formed in said substrate and having first and second terminals;
a functional circuit formed in said substrate and being coupled to said anti-fuse, said functional circuit being enabled responsive to programming said anti-fuse; and
a programming circuit formed in said substrate for programming said anti-fuse, said programming circuit including a first switching circuit connected between a first externally accessible terminal of said integrated circuit and the first terminal of said anti-fuse, said first switching circuit further having an enable input, said first switching circuit being capable of coupling a first programming voltage having one polarity from said first externally accessible terminal to the first terminal of said anti-fuse responsive to a program enable signal being applied to the enable input of said first switching circuit, said programming circuit further including a second switching circuit connected between a second externally accessible terminal of said integrated circuit and the second terminal of said anti-fuse, said second switching circuit further having an enable input, said second switching circuit being capable of coupling a second programming voltage having a polarity opposite that of the first programming voltage from said second externally accessible terminal to the second terminal of said anti-fuse responsive to said program enable signal being applied to the enable input of said second switching circuit whereby a voltage corresponding to the difference between said first and second programming voltages is applied to said anti-fuse responsive to said program enable signal.

13. The dynamic random access memory of claim 12 wherein at least one of said programming circuits is formed in a well that is electrically isolated from said substrate.

14. The dynamic random access memory of claim 12 wherein said first switching circuit is formed in said substrate, and wherein said second switching circuit is formed in a well that is electrically isolated from said substrate.

15. The dynamic random access memory of claim 14 wherein said first and second switching circuits each include at least one MOSFET to which said first and second programming voltages are applied, respectively, and wherein said second programming voltage has a polarity that forward-biases a junction formed by its respective MOSFET and said well.

16. The dynamic random access memory of claim 15 wherein said substrate and said well are of a p-type material so that said MOSFETs are NMOS transistors, and wherein said second programming voltage has a negative polarity and said first programming voltage has a positive polarity.

17. The dynamic random access memory of claim 12 wherein said first and second switching circuits each include a respective series MOSFET having its source and drain connected in series between its respective externally accessible terminal and its respective terminal of said anti-fuse, and wherein each of said series MOSFETs is coupled to the enable input of its respective switching circuit and is turned on responsive to said program enable signal.

18. The dynamic random access memory of claim 17 wherein one of said switching circuits further includes a shunt MOSFET having its source and drain connected between its respective terminal of said anti-fuse and a fixed voltage, and wherein said shunt MOSFET is coupled to the enable input of its switching circuit and is turned off responsive to said program enable signal and is turned on responsive to the absence of said program enable signal.

19. The dynamic random access memory of claim 12, further including an isolation circuit connected between said well and said substrate and coupled to said program enable signal, said isolation circuit electrically isolating said well from said substrate responsive to said program enable signal and electrically connecting said well to said substrate responsive to the absence of said program enable signal.

20. The dynamic random access memory of claim 12 wherein said first programming voltage is of a positive polarity and said second programming voltage is of a negative polarity.

21. The dynamic random access memory of claim 12 wherein said functional circuit includes a plurality of redundant memory cells that are activated to replace memory cells in said array when said anti-fuse is programmed.

22. A computer system, comprising:
a processor;
an input device;
an output device; and
a dynamic random access memory ("DRAM") fabricated on an integrated circuit having a substrate, said DRAM including an array of memory cells formed in said substrate in rows and columns, an anti-fuse formed in said substrate and having first and second terminals, a functional circuit formed in said substrate and being coupled to said anti-fuse, said functional circuit being enabled responsive to programming said anti-fuse, and a programming circuit formed in said substrate for programming said anti-fuse, said programming circuit including a first switching circuit connected between a first externally accessible terminal of said integrated circuit and the first terminal of said anti-fuse, said first switching circuit further having an enable input, said first switching circuit being capable of coupling a first programming voltage having one polarity from said first externally accessible terminal to the first terminal of said anti-fuse responsive to a program enable signal applied to the enable input of said first switching circuit, said programming circuit further including a second switching circuit connected between a second externally accessible terminal of said integrated circuit and the second terminal of said anti-fuse, said second switching circuit further having an enable input, said second switching circuit being capable of coupling a second programming voltage having a polarity opposite that of the first programming voltage from said second externally accessible terminal to the second terminal of said anti-fuse responsive to said program enable signal being applied to the enable input of said second switching circuit whereby a voltage corresponding to the difference between said first and second programming voltages is applied to said anti-fuse responsive to said program enable signal.

23. The computer system of claim 22 wherein at least one of said programming circuits is formed in a well that is electrically isolated from said substrate.

24. The computer system of claim 22 wherein said first switching circuit is formed in said substrate, and wherein said second switching circuit is formed in a well that is electrically isolated from said substrate.

25. The computer system of claim 24 wherein said first and second switching circuits each include at least one MOSFET to which said first and second programming voltages are applied, respectively, and wherein said second programming voltage has a polarity that forward-biases a junction formed by its respective MOSFET and said well.

26. The computer system of claim 25 wherein said substrate and said well are formed with p-type doping so that said MOSFETs are NMOS transistors, and wherein said second programming voltage has a negative polarity and said first programming voltage has a positive polarity.

27. The computer system of claim 22 wherein said first and second switching circuits each include a respective series MOSFET having its source and drain connected in series between its respective externally accessible terminal and its respective terminal of said anti-fuse, and wherein each of said series MOSFETs is coupled to the enable input of its respective switching circuit and is turned on responsive to said program enable signal.

28. The computer system of claim 27 wherein one of said switching circuits further includes a shunt MOSFET having its source and drain connected between its respective terminal of said anti-fuse and a fixed voltage, and wherein said shunt MOSFET is coupled to the enable input of its switching circuit and is turned off responsive to said program enable signal and is turned on responsive to the absence of said program enable signal.

29. The computer system of claim 22, further including an isolation circuit connected between said well and said substrate and coupled to said program enable signal, said isolation circuit electrically isolating said well from said substrate responsive to said program enable signal and electrically connecting said well to said substrate responsive to the absence of said program enable signal.

30. The computer system of claim 22 wherein said first programming voltage is of a positive polarity and said second programming voltage is of a negative polarity.

31. The computer system of claim 22 wherein said input device is a keyboard.

32. The computer system of claim 22 wherein said output device is a display.

33. The computer system of claim 22 wherein said functional circuit includes a plurality of redundant memory cells that are activated to replace memory cells in said array when said anti-fuse is programmed.

34. A method of programming an anti-fuse fabricated on a substrate in an integrated circuit with first and second terminals, said method comprising:
applying a positive voltage to the first terminal of said anti-fuse, said positive voltage being positive with respect to said substrate; and
applying a negative voltage to the second terminal of said anti-fuse, said negative voltage being negative with respect to said substrate, so that the voltage applied across the first and second terminals of said anti-fuse is greater than either said positive voltage or said negative voltage.

35. The method of claim 34 wherein said positive voltage is applied to the first terminal of said anti-fuse from a source external to said integrated circuit.

36. The method of claim 34 wherein said negative voltage is applied to the second terminal of said anti-fuse from a source external to said integrated circuit.

37. The method of claim 34 wherein said positive voltage and said negative voltage are applied to the first and second terminals, respectively, of said anti-fuse from respective sources external to said integrated circuit.

38. The method of claim 34 wherein said anti-fuse is formed by first and second conductive plates connected to said first and second terminals, respectively, said plates being separated from each other by a non-conductive material.

39. A method of altering the operation of a functional circuit fabricated in a substrate of an integrated circuit after the integrated circuit has been fabricated, the functional circuit being enabled responsive to the programming of a programmable impedance element, the method comprising:
applying a positive voltage to a first terminal of the programmable impedance element, the positive voltage being positive with respect to the substrate; and
applying a negative voltage to a second terminal of the programmable impedance element, the negative voltage being negative with respect to the substrate so that the voltage applied across the first and second terminals of the programmable impedance element is greater than either the positive voltage or the negative voltage.

40. The method of claim 39 wherein the positive voltage is applied to the first terminal of the programmable impedance element from a source external to the integrated circuit.

41. The method of claim 39 wherein the negative voltage is applied to the second terminal of the programmable impedance element from a source external to the integrated circuit.

42. The method of claim 39 wherein the positive voltage and the negative voltage are applied to the first and second terminals, respectively, of the programmable impedance element through respective first and second externally accessible terminals of the integrated circuit.

43. The method of claim 42, further comprising isolating at least one of the first and second externally accessible terminals from the first and second terminals of the programmable impedance element after applying the positive voltage to the first externally accessible terminal and applying the negative voltage to the second externally accessible terminal of the integrated circuit.

44. The method of claim 42, further comprising the following steps performed after applying the positive voltage to the first terminal of the programmable impedance element and applying the negative voltage to the second terminal of the programmable impedance element:
isolating the first externally accessible terminal from the first terminal of the programmable impedance element;
isolating the second externally accessible terminal from the second terminal of the programmable impedance element; and
coupling one of the first and second terminals of the programmable impedance element to a fixed voltage node.

45. The method of claim 39 wherein the programmable impedance element comprises an anti-fuse that is programmed to a low impedance state by passing current through the anti-fuse.

46. The method of claim 45 wherein the anti-fuse is formed by first and second conductive plates connected to the first and second terminals, respectively, the plates being separated from each other by a non-conductive material.

47. The method of claim 39, further comprising coupling one of the first and second terminals of the programmable impedance element to a fixed voltage node after applying the positive voltage to the first terminal of the programmable impedance element and applying the negative voltage to the second terminal of the programmable impedance element.

48. The method of claim 39 wherein the functional circuit comprises a memory device having a plurality of memory cells.

49. The method of claim 48 wherein the step of altering the operation of a functional circuit comprises substituting a group of functioning memory cells for a group of the memory cells containing the defective memory cell, the functioning memory cells being substituted responsive to the programming of the programmable impedance element.

50. The method of claim 39 wherein the steps of applying the positive voltage to the first terminal of the programmable impedance element and applying the negative voltage to the second terminal of the programmable impedance element comprises:
- coupling the first terminal of the programmable impedance element to a first externally accessible terminal of the integrated circuit;
- coupling the second terminal of the programmable impedance element to a second externally accessible terminal of the integrated circuit;
- applying the positive voltage to the first externally accessible terminal of the integrated circuit; and
- applying the negative voltage to the second externally accessible terminal of the integrated circuit.

51. The method of claim 39 wherein programming of the programmable impedance element alters the impedance of the programmable impedance element.

52. The method of claim 39 wherein the programmable impedance element is programmed by an electrical current flowing through the programmable impedance element from the first terminal to the second terminal responsive to applying the positive voltage to the first terminal and the negative voltage to the second terminal of the programmable impedance element.

53. In a memory device fabricated on a substrate of an integrated circuit, a method of substituting a functioning group of memory cells for a group of memory cells in which at least one of the memory cells is defective, the functioning group of memory cells being substituted responsive to programming an anti-fuse to a relatively low impedance state, the method comprising:
- applying a positive voltage to a first terminal of the anti-fuse, the positive voltage being positive with respect to the substrate; and
- applying a negative voltage to a second terminal of the anti-fuse, the negative voltage being negative with respect to the substrate so that the voltage applied across the first and second terminals of the anti-fuse is greater than either the positive voltage or the negative voltage.

54. The method of claim 53 wherein the positive voltage is applied to the first terminal of the anti-fuse from a source external to the memory device.

55. The method of claim 53 wherein the negative voltage is applied to the second terminal of the anti-fuse from a source external to the memory device.

56. The method of claim 53 wherein the positive voltage and the negative voltage are applied to the first and second terminals, respectively, of the anti-fuse through respective first and second externally accessible terminals of the memory device.

57. The method of claim 56, further comprising isolating at least one of the first and second externally accessible terminals from the first and second terminals of the anti-fuse after applying the positive voltage to the first externally accessible terminal and applying the negative voltage to the second externally accessible terminal of the memory device.

58. The method of claim 56, further comprising the following steps performed after applying the positive voltage to the first terminal of the anti-fuse and applying the negative voltage to the second terminal of the anti-fuse:
- isolating the first externally accessible terminal from the first terminal of the anti-fuse;
- isolating the second externally accessible terminal from the second terminal of the anti-fuse; and
- coupling one of the first and second terminals of the anti-fuse to a fixed voltage node.

59. The method of claim 53, further comprising coupling one of the first and second terminals of the anti-fuse to a fixed voltage node after applying the positive voltage to the first terminal of the anti-fuse and applying the negative voltage to the second terminal of the anti-fuse.

60. The method of claim 53 wherein the memory cells in the memory device are arranged in an array of rows and columns, and wherein the group of functioning memory cells substituted for the group of memory cells containing at least one defective memory cell comprises a row of the memory cells.

61. The method of claim 53 wherein the steps of applying the positive voltage to the first terminal of the anti-fuse and applying the negative voltage to the second terminal of the anti-fuse comprises:
- coupling the first terminal of the anti-fuse to a first externally accessible terminal of the memory device;
- coupling the second terminal of the anti-fuse to a second externally accessible terminal of the memory device;
- applying the positive voltage to the first externally accessible terminal of the memory device; and
- applying the negative voltage to the second externally accessible terminal of the memory device.

62. A method of programming a programmable impedance element fabricated in an integrated, the method comprising:
- applying a positive voltage to a first terminal of the programmable impedance element, the positive voltage being positive with respect to the substrate; and
- applying a negative voltage to a second terminal of the programmable impedance element, the negative voltage being negative with respect to the substrate so that the voltage applied across the first and second terminals of the programmable impedance element is greater than either the positive voltage or the negative voltage.

63. The method of claim 62 wherein the positive voltage is applied to the first terminal of the programmable impedance element from a source external to the integrated circuit.

64. The method of claim 62 wherein the negative voltage is applied to the second terminal of the programmable impedance element from a source external to the integrated circuit.

65. The method of claim 62 wherein the positive voltage and the negative voltage are applied to the first and second terminals, respectively, of the programmable impedance element from respective sources external to the integrated circuit.

66. The method of claim 62 wherein the programmable impedance element is formed by first and second conductive plates connected to the first and second terminals, respectively, the plates being separated from each other by a non-conductive material.

67. The method of claim 62 wherein the programmable impedance element is a component of a memory device fabricated in the integrated circuit.

68. The method of claim 62 wherein programming of the programmable impedance element alters the impedance of the programmable impedance element.

69. The method of claim 62 wherein the programmable impedance element is programmed by an electrical current flowing through the programmable impedance element from the first terminal to the second terminal responsive to applying the positive voltage to the first terminal and the negative voltage to the second terminal of the programmable impedance element.

\* \* \* \* \*